United States Patent [19]
Yang

[11] Patent Number: 5,804,250
[45] Date of Patent: Sep. 8, 1998

[54] METHOD FOR FABRICATING STABLE MAGNETORESISTIVE SENSORS

[75] Inventor: Danny D. Yang, San Diego, Calif.

[73] Assignee: Eastman Kodak Company, Rochester, N.Y.

[21] Appl. No.: 901,188

[22] Filed: Jul. 28, 1997

[51] Int. Cl.[6] ....................................... B05D 5/12
[52] U.S. Cl. .......................... 427/130; 427/131; 427/132; 427/548; 427/599
[58] Field of Search ................................ 427/131, 132, 427/130, 599, 548

Primary Examiner—Bernard Pianalto
Attorney, Agent, or Firm—William F. Noval

[57] ABSTRACT

A method of fabricating a stable, self-biased paired MR (magnetoresistive) sensor comprising the steps of depositing a first MR film with a diffusion barrier layer on either side on a substrate; depositing an oxide passivation/spacer layer on top of the first MR structure; depositing a second MR film with a diffusion barrier layer on either side on the spacer layer; depositing an oxide passivation layer on top of the second MR structure; wherein the MR films are deposited with induced uniaxial anisotropy; and thermal annealing both MR films to stabilize their anisotropy field.

5 Claims, 4 Drawing Sheets

METHOD FOR FABRICATING STABLE MAGNETORESISTIVE SENSORS

FIELD OF THE INVENTION

This invention relates in general to magnetic sensors and more particularly to a method for fabricating stable magnetoresistive sensors.

BACKGROUND OF THE INVENTION

A paired magnetoresistive (PMR) sensor for sensing magnetic fields consists of a matched pair of magnetoresistive (MR) elements, separated by a thin insulating spacer material. In a PMR sensor the sense current in each element flows in the same direction. The magnetic fields from the currents in each MR element provide a transverse bias field on the other element, making the sensor self-biased. The magnetic fields generated by the currents are equal in magnitude, but opposite in direction, the two MR elements are thus magnetically biased with magnetization angles of θ and −θ, respectively. The individual changes of each MR element resistance in response to a common signal field are therefore opposite to each other. The two MR element outputs are sensed differentially, canceling out false signals generated by thermal spikes as well as even-order nonlinear distortion in the readback signal.

The bias angle is basically determined by the bias field ($H_b$) and the anisotropy field ($H_k$), with the following simple relationship (provided that the demagnetizing field is negligible):

$$\theta = \sin^{-1}(H_b/H_k)$$

Optimal performance of the PMR head is roughly achieved at a nominal bias angle θ=60°, which combines high, small-signal sensitivity with good linear dynamic range. Therefore, the consistency of the output signal, or the stability of a self-biased PMR sensor with a given sense current, is largely dependent on the anisotropy field $H_k$ of MR element.

An MR element is typically a sputtered permalloy film with thickness between 150–300 Å. The induced uniaxial anisotropy of an MR element is established either during deposition or by annealing in a magnetic field subsequent to deposition. The value of anisotropy field $H_k$ in permalloy thus prepared is ≦3–5 Oe. However, the anisotropy field of an MR element is known to degrade when the element is subjected to a misaligned magnetic field at elevated temperatures. In a functioning PMR sensor, each MR element is biased by the magnetic field provided by the current in the other element. The heating generated by current in the presence of a misaligned magnetic field will reduce $H_k$ in each element with time. The reduction of $H_k$ increases the bias angle theta. Unless the sense current in each element is adjusted accordingly, the MR element is then overbiased and the sensitivity of the PMR sensor is reduced. There thus exists a need to fabricate MR elements with stable uniaxial anisotropy for PMR sensors.

SUMMARY OF THE INVENTION

According to the present invention, there is provided a solution to the problems of the prior art.

According to a feature of the present invention, there is provided a method of fabricating a stable, self-biased paired MR (magnetoresistive) sensor comprising the steps of: depositing a first MR film with a diffusion barrier layer on either side on a substrate; depositing an oxide passivation/spacer layer on top of the first MR structure; depositing a second MR film with a diffusion barrier layer on either side on the spacer layer; depositing an oxide passivation layer on top of the second MR structure; wherein the MR films are deposited with induced uniaxial anisotropy; and thermal annealing both MR films to stabilize their anisotropy field.

ADVANTAGEOUS EFFECT OF THE INVENTION

The invention has the following advantages.

1. MR elements are fabricated with stable uniaxial anisotropy for PMR sensors.
2. Thermally unstable defects such as vacancies and dislocations are eliminated by high temperature annealing.
3. MR elements with a uniaxial anisotropy are fabricated that do not degrade within the lifetime of the PMR sensor.

DETAILED DESCRIPTION OF THE INVENTION

Figure 1:
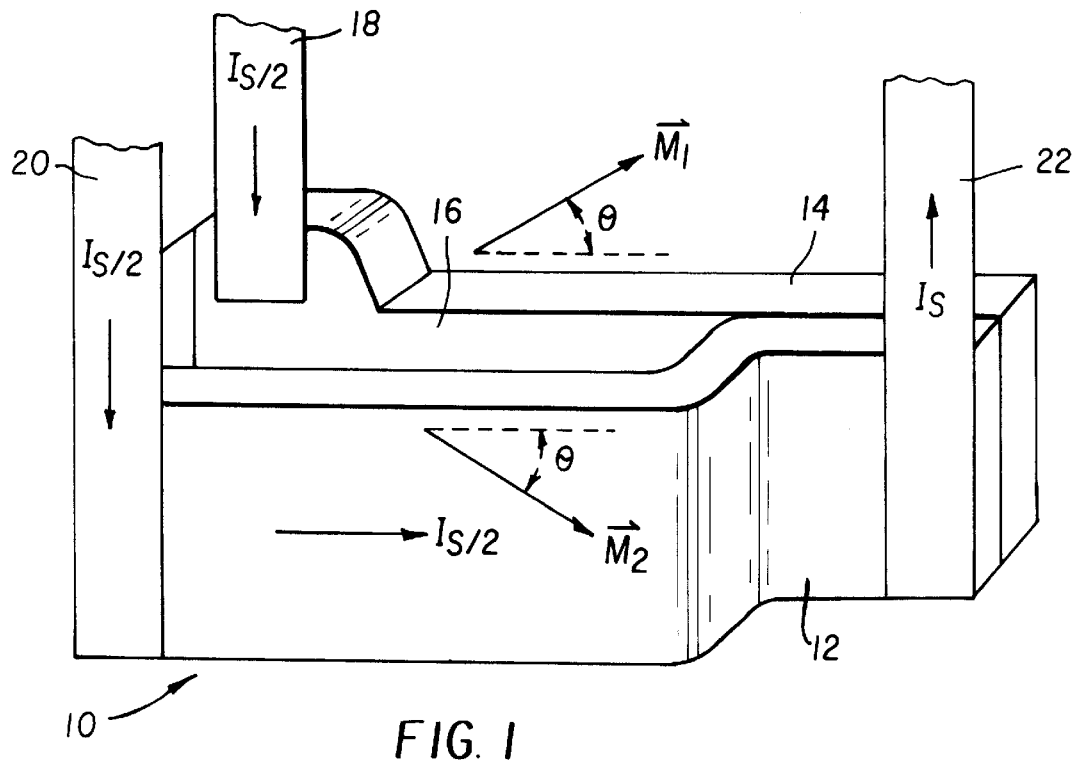
FIG. 1 is a diagrammatic view of a paired magnetoresistive sensor.

Referring to FIG. 1, a PMR sensor 10 includes a pair of sensing and mutually biased magnetoresistive (MR) elements 12 and 14. The MR elements are matched for MR characteristics, electrical resistivity, geometrical shape and dimensions. The MR elements are separated by an electrically insulating, nonmagnetic layer 16. A sense current flows in the same direction in each MR element. The bias field generated by the sense current $I_s$ rotates magnetization with an angle of θ with respect to the direction of current flow. The magnetization angles θ in the paired MR element 12,14 are equal in magnitude but opposite in direction. The sense current $I_s$ flows into terminals 18,20 through MR elements 12,14 and out terminal 22.

Figure 2:
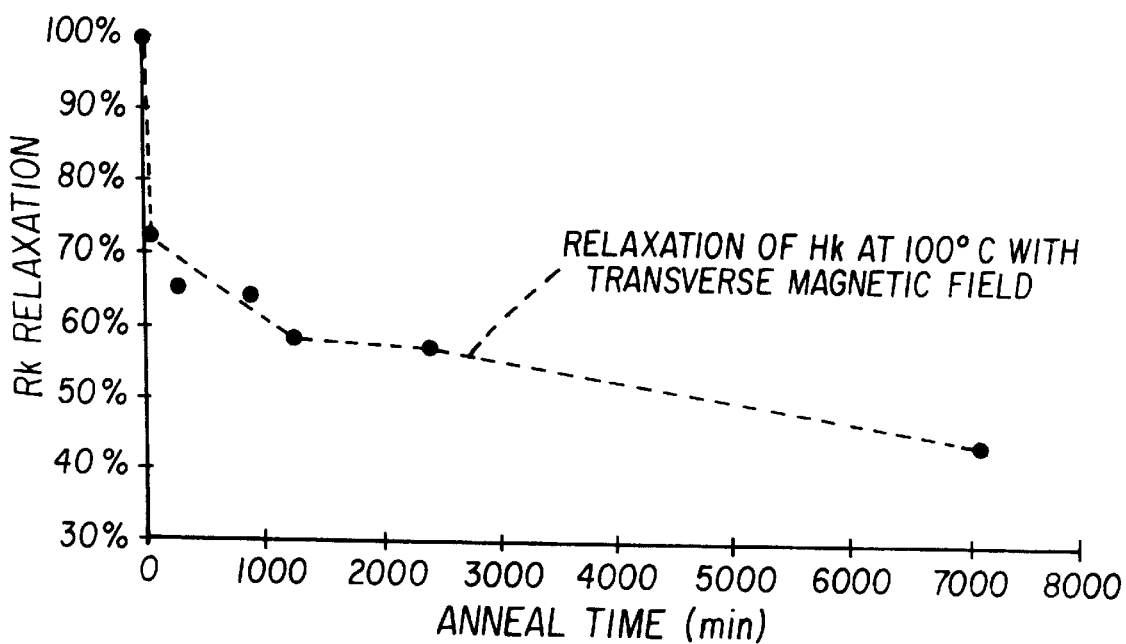
FIG. 2 is a graphical view of $H_k$ relaxation vs. anneal time at 100° C.

The consistent performance of a PMR sensor for a predetermined sense current relies on the bias angle θ, which is in turn dependent on the uniaxial anisotropy field $H_k$ of the MR elements. However, experimental results show that $H_k$ is rapidly reduced when as sputtered MR films are subjected to misaligned magnetic annealing at elevated temperatures. FIG. 2 gives an example of $H_k$ relaxation of an MR film heated at 100° C. in a magnetic field perpendicular to its easy axis direction. This is similar to the conditions found in an operating PMR sensor. The stability, therefore the lifetime, of a PMR sensor with sputtered NiFe (Nickel Ferrite) MR films is thus limited.

The origin of uniaxial anisotropy in MR films can be attributed to low activation energy mechanisms such as lattice defects (vacancies, dislocations, interstitials, etc.), impure atoms/ions and contamination in the film; as well as high activation energy mechanisms such as Fe vacancy/ interstitial superstructure, and directional ordering of Fe atom pairs. The relaxation of uniaxial anisotropy $H_k$ is due to redistribution and/or reduction of low activation energy mechanisms at elevated temperatures. The aim of the present invention is to develop a method which would reduce/ eliminate the low activation energy mechanisms while enhance the high activation energy contributors for uniaxial anisotropy in MR films. This in turn would result in stable PMR sensor devices.

Annealing as-sputtered MR films at elevated temperatures reduces lattice defects. This should lessen the change of $H_k$ under PMR operating conditions. Furthermore, to anneal MR films in a magnetic field parallel to the easy axis direction at elevated temperatures would enhance the directional ordering of Fe atom pairs, maintaining $H_k$ at the desired value. Depending on the annealing temperature, MR films can be passivated by photoresist, or dielectric films such as $SiO_2$ (silicon dioxide) or $Al_2O_3$ (aluminum oxide) or diffusion barrier such as Ta.

Figure 3:
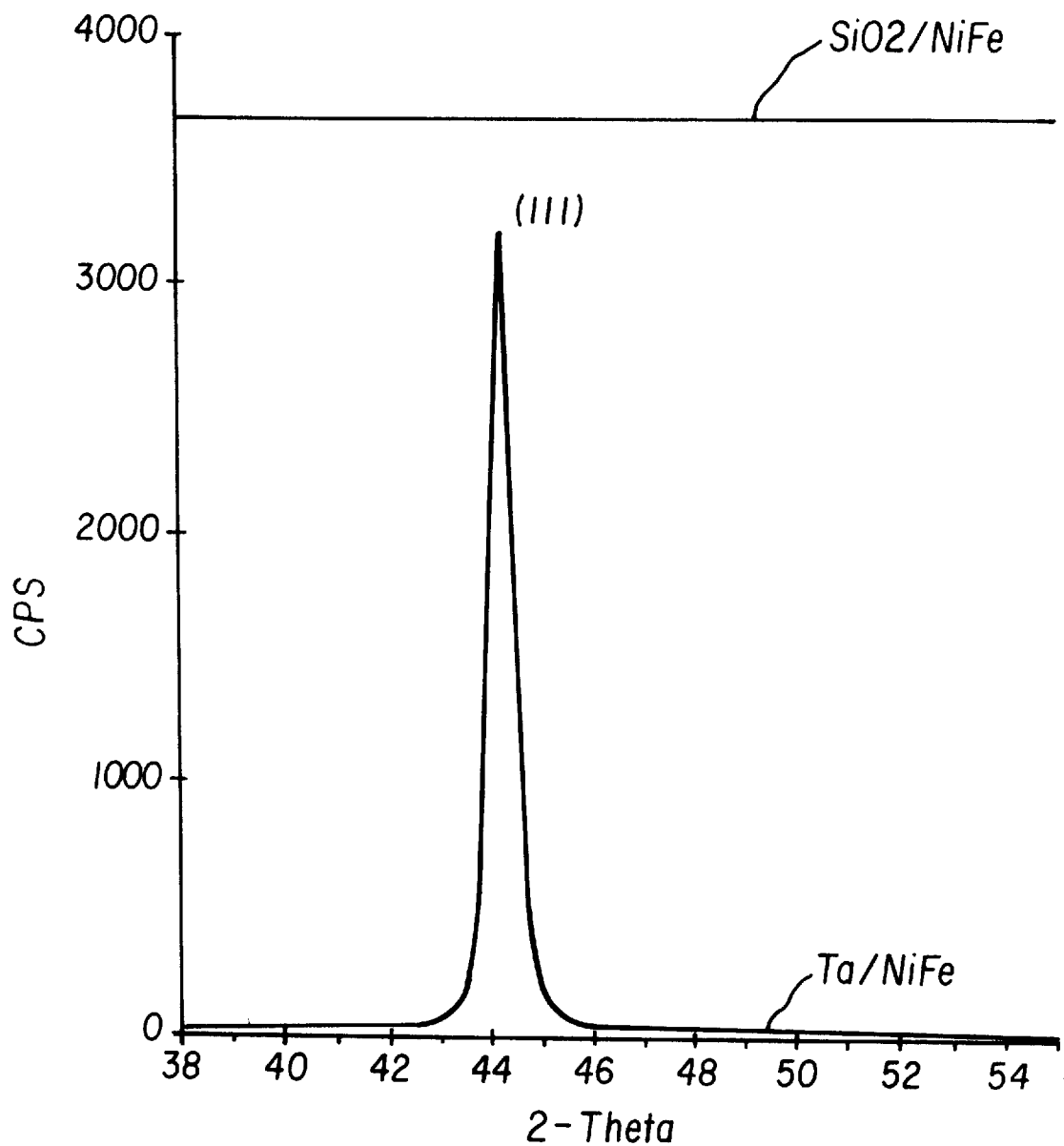
FIG. 3 is a graphical view of a comparison of x-ray diffraction patterns of NiFe with and without Ta underlayer.

It was further determined that the higher the annealing temperature in the parallel magnetic field, the more stable the $H_k$ of the MR element is under operating conditions. However, as-sputtered MR films can only withstand an annealing temperature up to 250° C., above which the MR films show signs of deterioration. The MR property change is due to interdiffusion occurred between MR and over/ under-lying films. Diffusion barrier film, such as Ta (tantalum), which also promotes texture and grain growth in NiFe MR films, is therefore sputtered on either one or both sides of the MR film to prevent interdiffusion at high temperatures. FIG. 3 shows a comparison of x-ray diffraction patterns between NiFe MR films sputtered with and without Ta underlayer. The NiFe film sputtered with Ta underlayer exhibit strong (111) texture, the peak intensity indicates much larger grains, therefore less grain boundaries which are susceptible to oxidation. With a diffusion barrier, the MR films can be annealed at temperatures as high as 300° C.

Figure 4:
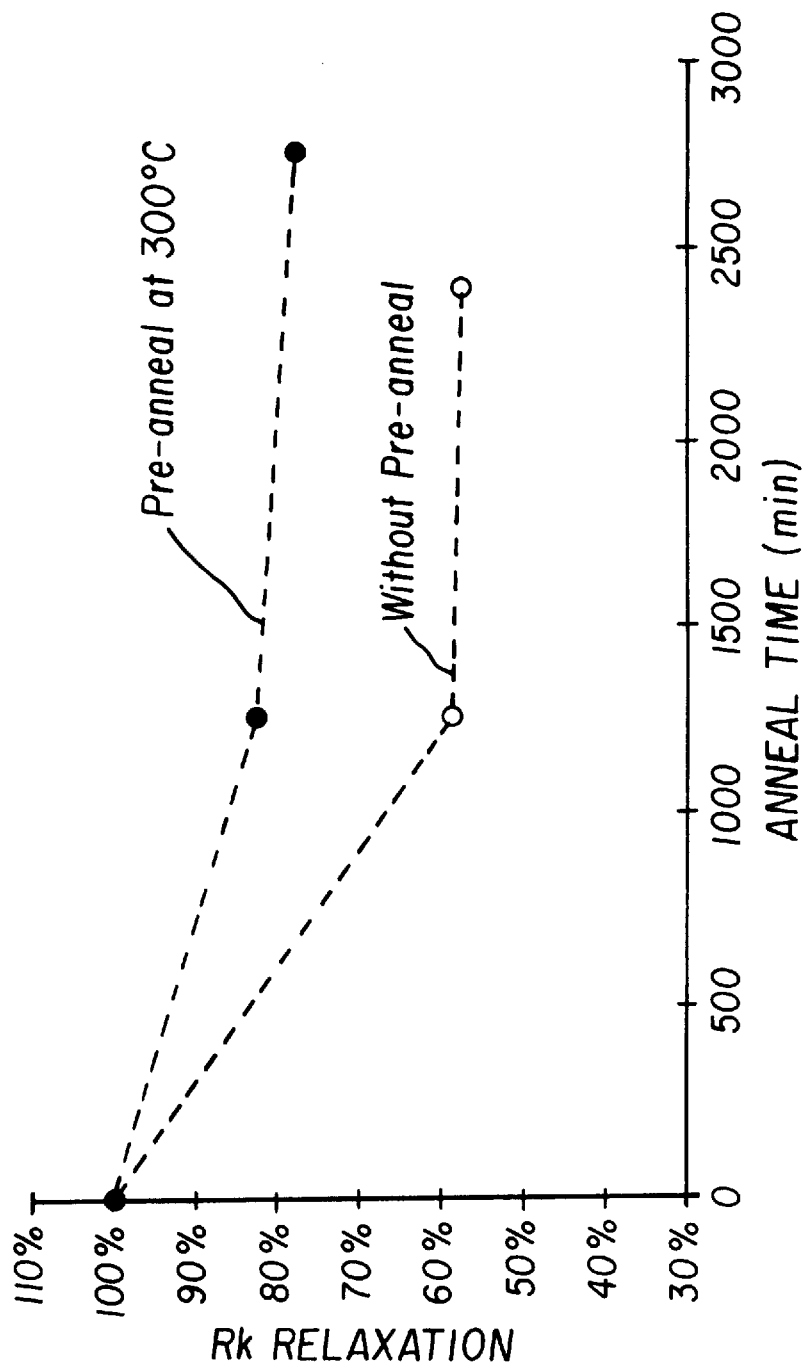
FIG. 4 is a graphical view of relaxation of $H_k$ at 100° C. with transverse magnetic field with and without preannealing at 300° C.

FIG. 4 compares $H_k$ relaxation of as-sputtered, and pre-annealed MR films, in a transverse magnetic field at 100° C. It clearly shows the dramatic improvement of $H_k$ stability in pre-annealed MR films. Higher pre-anneal temperature results in more stable $H_k$. In the case of as-sputtered MR film, the $H_k$ value after 20 hours is reduced more than 40%, which is unacceptable in device applications.

Figure 6:
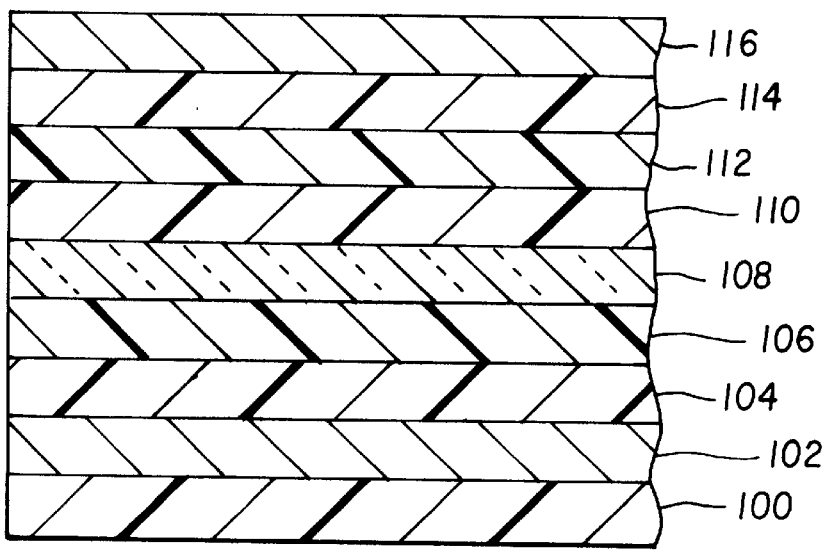
FIG. 6 is a sectional view of a PMR fabricated according to the present invention.

The method for fabricating stable PMR sensors, such as shown in FIG. 6, includes the following steps.

A diffusion barrier layer 102, such as 50–100 Å Ta is sputtered on an insulating substrate 100 prior to deposition of the first MR film 104. A magnetic field is present when depositing the MR film 104 to induce uniaxial anisotropy. Another diffusion barrier 106 of Ta is then sputtered on top of the MR film 104. After deposition of the spacer layer 108 (dielectric material such as $SiO_2$ or $Al_2O_3$), the second MR film 112 is deposited in the same fashion as the first MR film 104, i.e., between deposition of diffusion layers 110,114. The wafer is then removed from the deposition system and subjected to thermal annealing. The annealing temperatures range from 100° to 300° C. for several hours, depending on the stability requirement. The annealing is preferably done in a magnetic field of 100–1000 Oe parallel to the established easy axis direction, although annealing without the magnetic field present would still result in enhanced $H_k$ stability. If the annealing temperature is higher than 100° C., it is preferred to deposit a passivation layer 116 such as $Al_2O_3$ on top of the MR structure. The thermal annealing environment is preferably under vacuum to avoid possible contamination during annealing cycle.

Thermal annealing can be performed on each individual MR element as it is deposited or on both MR elements at the same time. This is determined by the convenience or necessities of device processing steps. Magnetic annealing is preferably done on unpatterned MR films. The tope passivation layer 116 can either be removed after annealing or remain as part of the structure.

Figure 5:
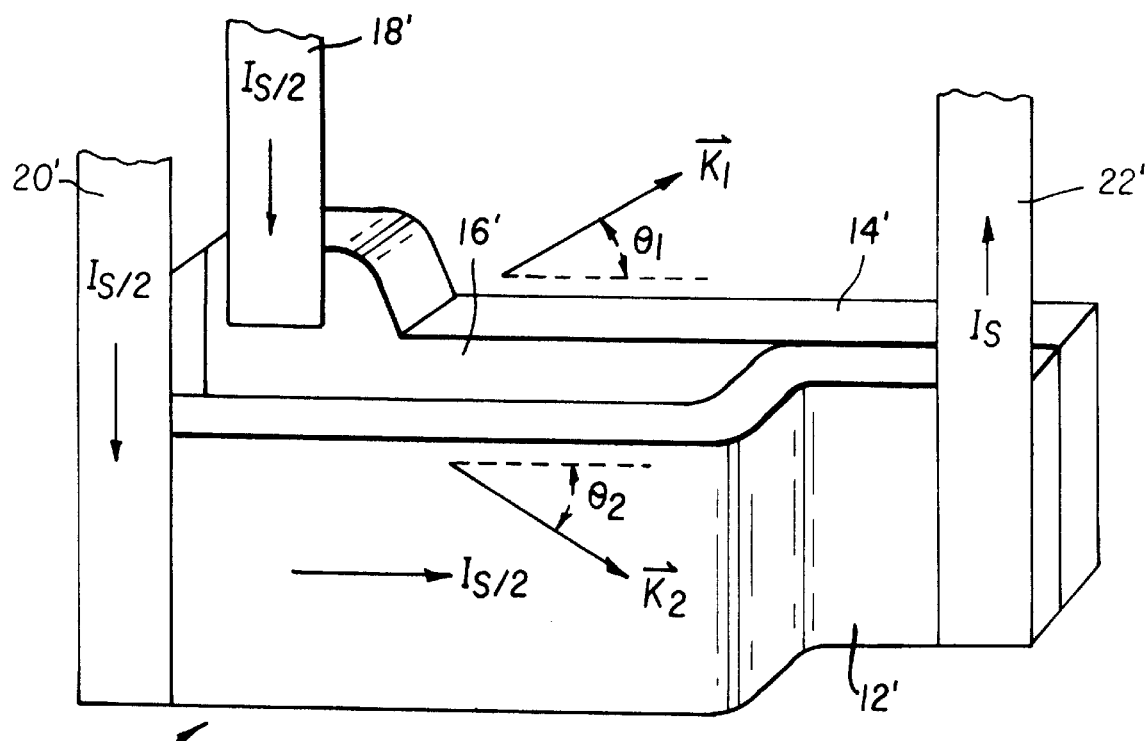
FIG. 5 is a diagrammatic view of a canted axis PMR sensor.

Another application for the present invention is to fabricate canted uniaxial anisotropy paired MR heads. In order to provide a PMR head that is self-biased with substantially lower sense current, particularly in wide track-width devices, the orientation of induced uniaxial anisotropy in each MR element is aligned at a specific angle to the stripe longitudinal direction. In the case where uniaxial anisotropy directions are different in two MR elements, as shown in FIG. 5, the anisotropy field $H_k$ in the first MR element has to be sufficiently stable for fabrication of the second MR element. The elements of the PMR sensor of FIG. 5 are identical to the PMR sensor of FIG. 1, but are labeled with reference numerals 10'–22'. The method for fabricating canted anisotropy axes PMR sensor is summarized as follows.

A diffusion barrier layer such as 50–100 Å Ta is sputtered on an insulating substrate prior to deposition of the first MR film. A magnetic field is present when depositing the first MR film to induce a predetermined uniaxial anisotropy. Another diffusion barrier is then sputtered on top of the MR film. The PMR spacer layer (e.g., 1500 Å $Al_2O_3$), which also serves as the MR passivation layer, is deposited prior to thermal annealing of the first MR element. Thermal annealing (e.g., at 300° C. for 6 hours) is preferably done under vacuum, with a magnetic field present in the direction parallel to that applied during the deposition of the first MR film. The first annealing is to stabilize the magnitude and direction of the induced anisotropy of the first MR layer. It is most effective to anneal unpatterned MR films since the demagnetizing field from patterned MR film would greatly reduce the effect. The second MR film is then deposited on the spacer layer in a similar fashion except that the magnetic field is aligned in a different orientation to that of the first MR element, inducing an uniaxial anisotropy that is canted to that of the first MR element. Since the anisotropy is sufficiently stabilized, the process of depositing the second MR film would neither reorient the easy axis of the first MR film, nor reduce its anisotropy field. The second MR element can also be stabilized by thermal annealing. To avoid disturbance of the first MR element, thermal annealing on the second MR film is preferably performed under less severe conditions, i.e., at reduced temperatures and/or time; or perform the annealing without a magnetic field present.

In addition, this invention can be applied to any MR device fabrication process that requires magnetic annealing not parallel to the MR anisotropy direction. For example, in exchange coupled MR devices, in the case where the exchange pinning direction needs to be set at a different angle than the MR anisotropy direction, the stabilizing process may be required to prevent the degradation of MR films.

The invention has been described in detail with particular reference to certain preferred embodiments thereof, but it will be understood that variations and modifications can be effected within the spirit and scope of the invention.

| PARTS LIST | |
|---|---|
| 10,10' | sensors |
| 12,12' | elements |
| 14,14' | elements |
| 16,16' | layers |
| 18,18' | terminals |
| 20,20' | terminals |
| 22,22' | terminals |
| 100 | insulating substrate |
| 102 | barrier layer |
| 104 | film |
| 106 | barrier |
| 108 | spacer layer |
| 110,114 | diffusion layers |
| 112 | film |
| 116 | passivation layer |

What is claimed is:

1. A method of fabricating a stable, self-biased paired MR (magnetoresistive) sensor comprising the steps of:

depositing a first MR film with a diffusion barrier layer on either side on a substrate;

depositing an oxide passivation/spacer layer on top of the first MR structure;

depositing a second MR film with a diffusion barrier layer on either side on the spacer layer;

depositing an oxide passivation layer on top of the second MR structure;

wherein said MR films are deposited with induced uniaxial anisotropy; and thermal annealing both MR films to stabilize their anisotropy field.

2. The method of claim 1 wherein the thermal annealing process is carried out with a magnetic field parallel to the original uniaxial anisotropy direction.

3. The method of claim 1 wherein said first and second MR films are nickel ferrite (NiFe) and wherein said diffusion barrier layers are tantalum which promotes texture and grain growth in the NiFe MR films and inhibits oxidation of MR films during thermal annealing.

4. A method of fabricating a canted axis paired MR sensor comprising the steps of:

depositing on a substrate a first MR film with induced uniaxial anisotropy with an angle $\theta_1$ relative to the MR stripe longitudinal direction;

depositing a diffusion barrier layer on either side of the first MR film;

depositing a passivation spacer layer on top of the first MR film;

thermal annealing said first MR film to stabilize the magnitude and direction of the first MR anisotropy field;

depositing on said passivation/spacer layer a second MR film with induced uniaxial anisotropy with an angle $\theta_2$ relative to the MR stripe longitudinal direction;

depositing a diffusion barrier layer on either side of the second MR film;

depositing a passivation layer on top of the second MR film; and thermal annealing said second MR film to stabilize the magnitude and direction of the second MR anisotropy field.

5. The method of claim 4 wherein said thermal annealing steps are performed with a magnetic field parallel to the respective induced anisotropy directions.

* * * * *